United States Patent
Dumoulin et al.

[11] Patent Number: 6,130,478
[45] Date of Patent: Oct. 10, 2000

[54] POLYMER STUD GRID ARRAY FOR MICROWAVE CIRCUIT ARRANGEMENTS

[75] Inventors: Ann Dumoulin, Zedelgem; Marcel Heerman, Merelbeke; Jean Roggen, Lummen; Eric Beyne, Leuven; Rita van Hoof, Boortmeerbeek, all of Belgium

[73] Assignees: Siemens N.V., Brussels; Interuniversitair Micro-Electronica-Centrum VZW, Leuven, both of Belgium

[21] Appl. No.: 09/051,777

[22] PCT Filed: Oct. 10, 1996

[86] PCT No.: PCT/EP96/04404

§ 371 Date: Apr. 18, 1998

§ 102(e) Date: Apr. 18, 1998

[87] PCT Pub. No.: WO97/15077

PCT Pub. Date: Apr. 24, 1997

[30]     Foreign Application Priority Data

Oct. 16, 1995 [DE] Germany ............................ 195 38 465

[51] Int. Cl.[7] .................................................. H01L 23/34
[52] U.S. Cl. ...................... 257/728; 257/702; 257/725; 257/684; 257/276; 257/664
[58] Field of Search ................................... 257/728, 684, 257/725, 702, 276, 664; 333/246

[56]     References Cited

U.S. PATENT DOCUMENTS

| | | |
|---|---|---|
| 3,271,507 | 9/1966 | Elliott . |
| 3,483,308 | 12/1969 | Wakely . |
| 5,081,520 | 1/1992 | Yoshii et al. . |
| 5,206,712 | 4/1993 | Kornrumpf et al. ..................... 257/684 |
| 5,280,194 | 1/1994 | Richards et al. ......................... 257/725 |
| 5,387,888 | 2/1995 | Eda et al. ................................. 257/728 |

FOREIGN PATENT DOCUMENTS

| | | |
|---|---|---|
| 9609646 | 3/1996 | Belgium ..................... 23/13 |
| 0 361 192 A2 | 9/1989 | European Pat. Off. . |
| 0 617 466 A2 | 3/1994 | European Pat. Off. . |
| 0 645 953 A1 | 9/1994 | European Pat. Off. . |
| 37 32 249 A1 | 9/1987 | Germany . |
| WO 89/00346 | 6/1988 | WIPO . |
| WO 89/10005 | 3/1989 | WIPO . |
| WO 92/02040 | 7/1991 | WIPO . |
| WO 96/03020 | 7/1995 | WIPO . |
| WO 96/09646 | 9/1995 | WIPO . |

*Primary Examiner*—Matthew Smith
*Assistant Examiner*—Belur V Keshavan
*Attorney, Agent, or Firm*—Hill & Simpson

[57]     ABSTRACT

A polymer stud grid array for microwave circuits is proposed which includes an injection-molded, three-dimensional substrate that is fabricated from an electrically insulating polymer. The substrate includes a plurality of polymer studs which are arranged over the underside of the substrate and which are integrally formed with the substrate during the injection-molding process. Signal connections are formed on the studs which include an end surface that is capable of being soldered. Potential connections are formed on at least one of the studs. The potential connection also includes an end surface that is capable of being soldered. Striplines are also constructed which connect the studs to the microwave circuit. Each stripline includes a first structured metal layer disposed on the underside of the substrate, a dielectric layer disposed on the first metal layer and a second structured metal layer disposed on top of the dielectric layer. The first metal layer is electrically connected to the potential connection. The second metal layer connects the signal connections to an associated internal connection which is connected to the microwave circuit.

10 Claims, 1 Drawing Sheet

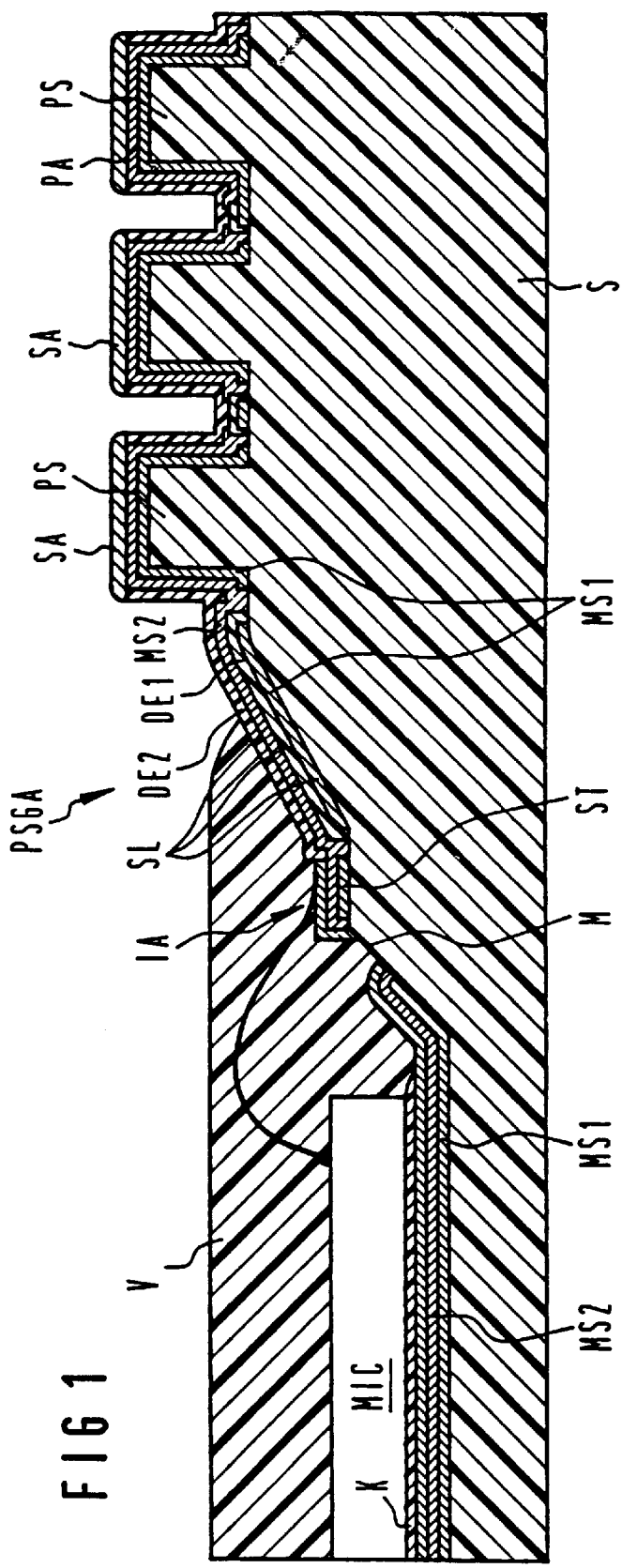
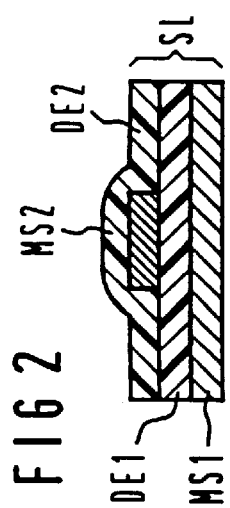

POLYMER STUD GRID ARRAY FOR MICROWAVE CIRCUIT ARRANGEMENTS

FIELD OF THE INVENTION

The present invention relates generally to polymer stud grid arrays for microwave circuits and, more specifically, to polymer stud grid arrays that include three-dimensional substrates with a plurality of studs on the underside thereof that are electrically connected to an integrated microwave circuit.

BACKGROUND OF THE INVENTION

The number of connections on integrated circuits is becoming ever greater, while they are at the same time being miniaturized to an ever greater extent. The difficulties expected in the course of this increase in miniaturization in the application of solder paste and component fitment are intended to be overcome by new housing forms, single-chip, few-chip or multi-chip modules in a ball grid array package being preferred, in particular, for this purpose (DE-Z productronic 5, 1994, pages 54, 55). These modules are based on a plated-through substrate, on which the chips are made contact with, for example, via contact-making wires or by means of flip-chip mounting. The ball grid array (BGA) is located on the underneath of the substrate, and is often also referred to as a solder grid array, land grid array or solder bump array. The ball grid array comprises solder studs arranged over the area on the underneath of the substrate, which allow surface mounting on printed circuit boards or assemblies. The arrangement of the solder studs over an area allows large numbers of connections to be provided, using a large grid size of, for example, 1.27 mm.

In the case of so-called MID technology (MID=Molded Interconnection Devices), injection-molded parts with integrated conductor runs are used instead of conventional printed circuits. High-quality thermo-plastics, which are suitable for the injection molding of three-dimensional substrates, form the basis of this technology. Such thermoplastics are distinguished over conventional substrate materials for printed circuits by better mechanical, thermal, chemical, electrical and environmental characteristics. In the case of one specific direction of MID technology, the so-called technology of injection-molded parts with integrated conductor runs, the structuring of a metal layer applied to the injection-molded parts is carried out without using the otherwise normal mask technique, by means of a special laser structuring method.

In this case, a plurality of mechanical and electrical functions can be integrated in the three-dimensional injection-molded parts with structured metallization. The housing support function at the same time provides guides and snap-action connections, while the metallization layer is used for electromagnetic shielding, and ensures good heat dissipation, as well as carrying out the wiring and connection function. Further details relating to the production of three-dimensional injection-molded parts with integrated conductor runs can be found, for example, in DE-A-37 32 249 or EP-A-0 361 192.

U.S. Pat. No. 5,081,520 discloses a method for mounting IC chips on substrates, in the case of which method the substrates are produced as injection-molded parts with integrated studs for attaching the IC chips. Once the studs have been metallized, a connecting layer is applied so that the IC chips can be mounted on the substrates, the chip connecting surfaces being electrically conductively connected to the associated metallizations on the studs.

International Application No. PCT/EP95/03763 has proposed a so-called polymer stud grid array (PSGA), which combines the advantages of a ball grid array (BGA) with the advantages of MID technology. The new version was called a polymer stud grid array (PSGA) on the basis of the ball grid array (BGA), the term "polymer stud" being intended to refer to the polymer studs which are integrally formed during the injection molding of the substrate. This version is suitable for single-chip, few-chip or multi-chip modules and comprises an injection-molded, three-dimensional substrate composed of an electrically insulating polymer, polymer studs which are arranged over the area on the underneath of the substrate and are integrally formed during injection molding, external connections which are formed on the polymer studs by an end surface which can be soldered, conductor runs which are formed at least on the underneath of the substrate and connect the external connections to internal connections, at least one chip which is arranged on the substrate and whose connections are electrically conductively connected to the internal connections.

In addition to the simple and cost-effective production of the polymer studs during the injection molding of the substrate, the production of the external connections on the polymer studs can also be carried out with minimal effort together with the production of the conductor runs, which is normal for MID technology and the technique of injection-molded parts with integrated conductor runs. The fine laser structuring which is preferred for the technique of injection-molded parts with integrated conductor runs allows the external connections to be produced on the polymer studs with a large number of connections and with a very fine grid. It should furthermore be stressed that the thermal expansion of the polymer studs corresponds to the thermal expansion of the substrate and to that of the printed circuit board accommodating the module. Should any mechanical stresses occur, then the elastic characteristics of the polymer studs allow the stresses to be at least partially compensated for. The dimensional stability of the external connections formed on the polymer studs also allows the reliability for repair and replacement to be considerably improved over ball grid arrays, whose external connections are formed by solder studs.

SUMMARY OF THE INVENTION

The present invention is based on the problem of providing a polymer stud grid array which is suitable for microwave circuit arrangements.

The present invention is based on the knowledge that polymer stud grid arrays are also suitable for microwave circuit arrangements since the striplines required for this purpose can be produced on the underneath of the substrate, with little additional effort.

According to claim 2, the striplines can be covered by a second dielectric layer which allows protection, as a type of solder resist cover, during soldering.

In an embodiment, the present invention provides a polymer stud grid array for microwave circuits that comprises an injection-molded, three-dimensional substrate comprising an electrically insulating polymer. The substrate further comprises an underside with a plurality of downwardly protruding polymer studs disposed thereon. The studs are integrally formed with the substrate or are injection-molded with the substrate. The underside of the substrate is also connected to at least one stripline which extends between the studs and at least one integrated microwave circuit that is disposed on the substrate. The stripline comprises a first structured metal layer that engages the underside of the substrate, a first dielectric layer disposed on the first metal layer and a second structured metal layer disposed on the first dielectric layer with the first dielectric layer being sandwiched between the first and second metal layers. Each stud is connected to a signal connection that overlies the stud. At least one of the studs is connected to a potential connection that is disposed between the respective signal connection and the stud. The first metal layer is electrically connected to the potential connection. The second metal layer electrically connects each of the signal connections to an associated internal connection. The associated internal connection is connected to the microwave circuit. The signal connections and the potential connections each comprise end surfaces which are capable of being soldered thereby enabling the signal connections and potential connection to be secured to the substrate structure.

In an embodiment, the stripline further comprises a second dielectric layer disposed on the second metal layer.

Other objects and advantages of the present invention will become apparent from reading the following detailed description and appended claims, and upon reference to the accompanying drawings.

BRIEF DESCRIPTION OF THE DRAWINGS

An exemplary embodiment of the invention is described in more detail in the following text and is illustrated in the drawing, in which:

FIG. 1 is a sectional view taken through a part of a polymer stud grid array having a microwave circuit with which contact is made using a wire bonding technique, and FIG. 2 is a cross section taken through a stripline of the polymer stud grid array illustrated in FIG. 1.

It should be understood that the drawings are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted. It should be understood, of course, that the invention is not necessarily limited to the particular embodiments illustrated herein.

DETAILED DESCRIPTION OF THE PRESENTLY PREFERRED EMBODIMENTS

FIG. 1 shows a highly simplified schematic illustration of a section through a part of a polymer stud grid array PSGA having an integrated microwave circuit MIC with which contact is made using a wire bonding technique. The illustrated array is based on a substrate S which is provided with polymer studs PS and a trough M, the trough M having a step designated ST. The substrate S, including the polymer studs PS, trough M and step ST, is produced by injection molding, thermoplastics which are resistant to high temperatures, such as polyetherimide, being suitable for use as substrate materials.

A first metal layer MS1, a second metal layer MS2 and an end surface E which can be soldered are applied successively to the substrate S in the region of the base of the trough M, the two metal layers MS1 and MS2 being composed, for example, of copper, and the end surface E which can be soldered being formed, for example, by a sequence of layers of nickel and gold. The integrated microwave circuit MIC is mounted in a face-up position on the end surface E using an electrically conductive adhesive K. The connections of the microwave circuit MIC, which are not designated in any more detail, are connected via contact-making wires KD to internal connections IA arranged on the step ST.

The layer sequence, mentioned above, comprising the first metal layer MS1, the second metal layer MS2 and the end surface E which can be soldered, is likewise applied to the polymer studs PS. The end surface E which can be soldered in this case forms a potential connection PA for at least one polymer stud PS, and signal connections SA for the other polymer studs PS. In the region of the potential connection PA, which is used in particular as a ground connection, the second metal layer MS2 is electrically isolated from the other regions of the second metal layer MS2 by means of trenches produced by laser structuring. In the region of the signal connections SA, the first metal layer MS1 is electrically isolated from the other regions of the first metal layer MS1 and, in particular, from the potential connection PA by means of trenches produced by laser structuring.

Striplines which are designated overall by SL are constructed on the underneath of the substrate S and are formed by the first structured metal layer MS1, a first dielectric layer DE1 applied to this metal layer MS1, the second structured metal layer MS2 and a second dielectric layer DE2. The striplines SL, a cross section of which is illustrated in FIG. 2, represent lines with a controlled impedance, which is governed by the geometry of the individual elements and, in particular, by the width of the metal layers MS1 and MS2 and by the thickness of the first dielectric layer DE1.

The tracks of the second metal layer MS2, which are used as strip conductors for the striplines SL, connect the signal connections SA to the associated internal connections IA.

Encapsulation V for the integrated microwave circuit MIC is formed by filling the trough M with plastic, the encapsulation V at the same time also forming mechanical protection for the contact-making wires KD.

From the above description, it is apparent that the objects of the present invention have been achieved. While only certain embodiments have been set forth, alternative embodiments and various modifications will be apparent from the above description to those skilled in the art. These and other alternatives are considered equivalents and within the spirit and scope of the present invention.

What is claimed is:

1. A polymer stud grid array for microwave circuits, the polymer stud grid array comprising:

an injection-molded, three-dimensional substrate comprising an electrically insulating polymer, the substrate further comprising an underside with a plurality of downwardly protruding polymer studs disposed thereon, the studs being integrally formed with the substrate, the underside of the substrate also being connected to at least one stripline which extends between the studs and at least one integrated microwave circuit, the stripline comprising a first structured metal layer that engages the underside of the substrate, the first metal layer engaging a first dielectric layer with the first metal layer being disposed between the first dielectric layer and the substrate, the first dielectric layer engaging a second structured metal layer with the first dielectric layer being disposed between the first and second metal layers, each stud being connected to a signal connection, each signal connection overlying its respective stud, at least one stud being connected to a potential connection with the potential connected being disposed between the respective signal connection and said at least one stud, the first metal layer being electrically connected to said at least one potential connection, the second metal layer electrically connecting each of said signal connections to an associated internal connection, the associated internal connection being electrically connected to the microwave circuit, the microwave circuit being disposed on the substrate, said signal connections and said at least one potential connection each comprising solderable metallic end surfaces.

2. The polymer stud grid array of claim 1 wherein the stripline further comprises a second dielectric layer disposed on the second metal layer with the second metal layer being disposed between the first and second dielectric layers.

3. A polymer stud grid array for a microwave circuit, the polymer stud grid array comprising:

an injection-molded, three-dimensional substrate comprising an electrically insulating polymer, the substrate further comprising an underside with a plurality of downwardly protruding polymer studs disposed thereon, the studs being integrally formed with the substrate, the underside of the substrate also being connected to a stripline which extends between the studs and a microwave circuit, the stripline comprising a first structured metal layer that engages the underside of the substrate, the first metal layer engaging a first dielectric layer with the first metal layer being disposed between the first dielectric layer and the underside of the substrate, the first dielectric layer engaging a second structured metal layer with the first dielectric layer being disposed between the first and second metal layers, at least one stud being connected to a potential connection with the potential connected being disposed between the stud and a signal connection that overlies the potential connection, the first metal layer being electrically connected to the potential connection, the second metal layer electrically connecting the signal connection to an associated internal connection, the associated internal connection being electrically connected to the microwave circuit, the microwave circuit being disposed on the substrate.

4. The polymer stud grid array of claim 3 wherein said signal connection and said potential connection each comprising metallic solderable end surfaces.

5. The polymer stud grid array of claim 3 wherein the stripline further comprises a second dielectric layer disposed on the second metal layer with the second metal layer being disposed between the first and second dielectric layers.

6. The polymer stud array of claim 3 wherein the microwave circuit is disposed between the underside of the substrate and an encapsulating layer.

7. A polymer stud grid array for a microwave circuit, the polymer stud grid array comprising:

a substrate comprising an electrically insulating polymer, the substrate further comprising an underside with a plurality of downwardly protruding polymer studs disposed thereon, the studs being integrally formed with the substrate, the underside of the substrate also being connected to a stripline which extends between the studs and a microwave circuit, the stripline comprising a first structured metal layer, a first dielectric layer and a second structured metal layer with the first dielectric layer being disposed between the first and second metal layers, at least one stud being connected to a potential connection with the potential connected being disposed between the stud and a signal connection that overlies the potential connection, the first metal layer being electrically connected to the potential connection, the second metal layer electrically connecting the signal connection to an associated internal connection, the associated internal connection being electrically connected to the microwave circuit.

8. The polymer stud grid array of claim 7 wherein said signal connection and said potential connection each comprising metallic solderable end surfaces.

9. The polymer stud grid array of claim 7 wherein the stripline further comprises a second dielectric layer disposed on the second metal layer with the second metal layer being disposed between the first and second dielectric layers.

10. The polymer stud array of claim 7 wherein the microwave circuit is disposed between the underside of the substrate and an encapsulating layer.

* * * * *